United States Patent [19]
Ohzu

[11] Patent Number: 5,159,186
[45] Date of Patent: Oct. 27, 1992

[54] PHOTOCONVERSION DEVICE WITH CAPACITIVE COMPENSATION IN SHIELDED DARK CURRENT ELEMENT

[75] Inventor: Hayao Ohzu, Fuchu, Japan

[73] Assignee: Canon Kabushiki Kaisha, Tokyo, Japan

[21] Appl. No.: 767,637

[22] Filed: Sep. 30, 1991

[30] Foreign Application Priority Data

Oct. 5, 1990 [JP] Japan .................. 2-266330

[51] Int. Cl.⁵ .............................................. H01J 40/14
[52] U.S. Cl. ............................ 250/208.1; 358/213.16; 357/30
[58] Field of Search ................ 250/208.1, 211 J; 357/30 D, 30 E, 30 G, 30 Q, 30 H; 358/213.11, 213.16, 213.23, 213.31

[56] References Cited

U.S. PATENT DOCUMENTS

4,740,824  4/1988  Yano et al. .................. 250/208.1
4,794,279  12/1988  Yamamura et al. ........... 358/213.16

Primary Examiner—David C. Nelms
Assistant Examiner—K. Shami
Attorney, Agent, or Firm—Fitzpatrick, Cella, Harper & Scinto

[57] ABSTRACT

A photoconversion device has light receiving cells and also a dark cell to provide a dark output to enable the signals from the light receiving cells to be compensated for noise due to dark current. The dark cell resembles the light cells, but its light receiving region is covered by a light shielding layer (5). Capacitive coupling between the light shielding layer (5) and a charge accumulation region (3) distorts the dark cell output so that it does not match the dark current noise in the light cell outputs. This capacitive coupling is reduced by interposing a conductive layer (1) between the light shielding layer and the charge accumulation region (2). Preferably the conductive layer (1) is connected to the read-out electrode. Preferably the read-out electrode (1) of the light cells is enlarged to further reduce the difference between the capacitance of the charge accumulation region (2) of the dark cell and that of the light cells.

25 Claims, 5 Drawing Sheets

FIG. I (A)
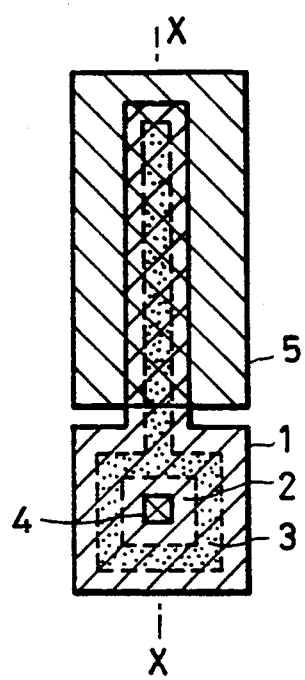
FIG. I (B)
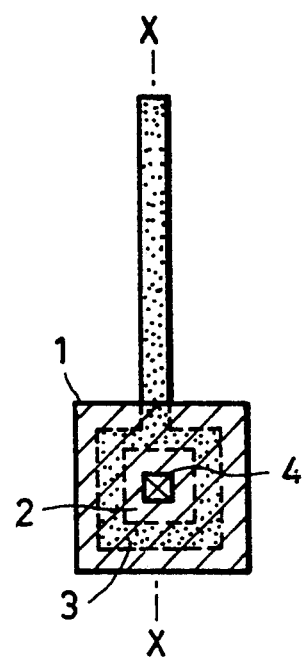
FIG. 2(A)
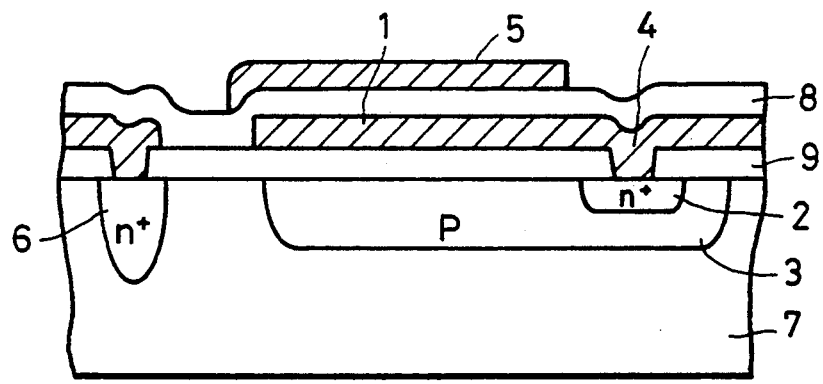
FIG. 2(B)
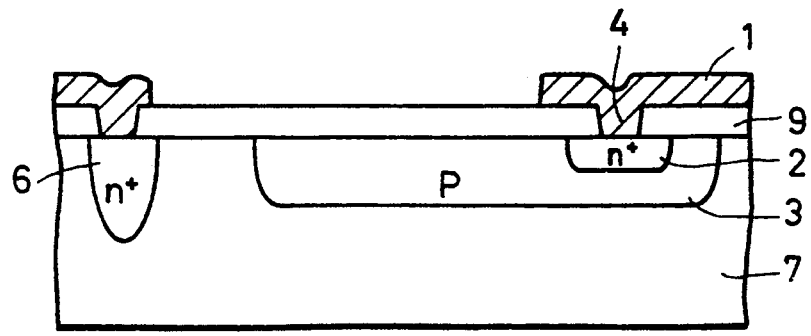

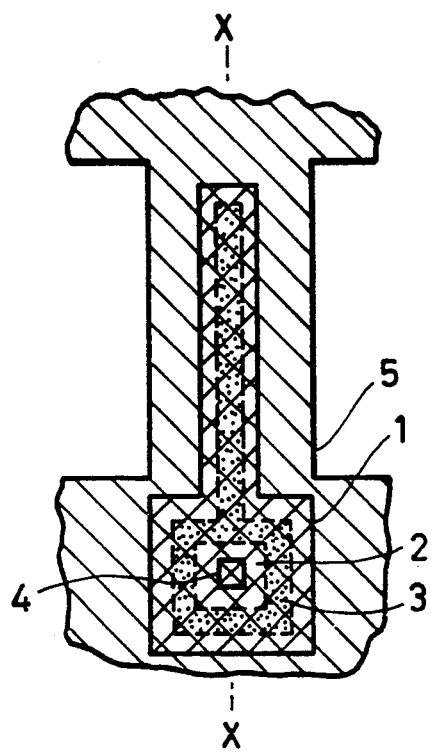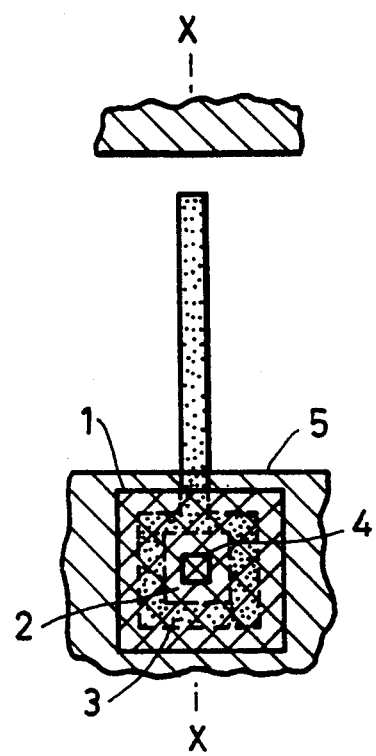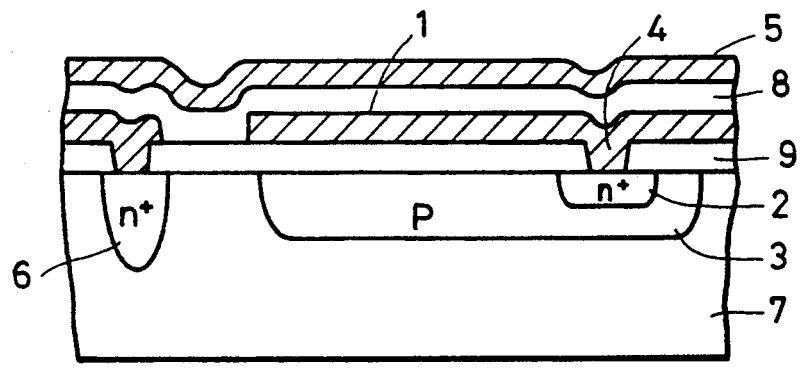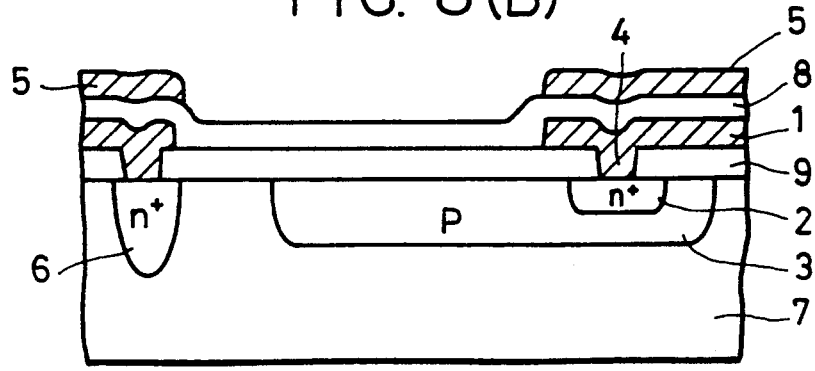

PHOTOCONVERSION DEVICE WITH CAPACITIVE COMPENSATION IN SHIELDED DARK CURRENT ELEMENT

FIELD OF THE INVENTION

This invention relates to a photoconversion device, particularly one which has a photoconversion element for outputting a signal corresponding to carriers generated by light incident on a light receiving region, and a further element which is shielded from light for obtaining an output corresponding to a dark output of the photoconversion element.

PRIOR ART

It is known, for example from U.S. Pat. No. 4,879,470 and EP-A-0260858, to provide dark pixels in a line sensor or an area sensor. The outputs of dark pixels may be used to compensate for a voltage component of light receiving pixels due to dark current, by subtracting the output of the dark pixels from the output signals of the light receiving pixels.

FIG. 4 illustrates a circuit diagram of a photo conversion device having a dark cell.

As is shown in the figure, a photoconversion device has n cells, and the first cell is used as a dark pixel and the second to nth cells are used as light receiving pixels. $T_d$, $T_1$-$T_{n-1}$ are photosensors such as for example bipolar type transistors. Signals corresponding to charges stored in their base regions are read out through their emitters.

$M_{dR}$, $M_{R1}$ to $M_{Rn-1}$ are MOS transistors for setting the base regions of the photosensors, under the control of a signal pulse $\phi_{RES}$. $M_{dT}$, $M_{T1}$ to $M_{Tn-1}$ are MOS transistors controlled by a signal pulse $\phi_T$ used for transferring signals from the photosensors $T_d$, $T_1$ to $T_{n-1}$ to storage capacitors $C_{Td}$, $C_{TS1}$ to $C_{TSn-1}$.

In this photoconversion device, when it is dark, the dark pixel and the light receiving pixels produce dark voltages due to dark current. On the other hand, when light is incident on the device, the dark pixel continues to produce the dark voltage while the light receiving pixels produce in this period signal voltages each corresponding to a sum of the dark voltage and a light signal voltage. The output signal from the dark pixel $T_d$ is transferred to the storage capacitor $C_{Td}$, and the output signals from the light receiving pixels $T_1$ to $T_{n-1}$ are transferred to the storage capacitors $C_{TS1}$ to $C_{TSn-1}$ respectively, by the pulse signal $\phi_T$.

Subsequently, the stored output signals can be read from the storage capacitors $C_{Td}$, $C_{TS1}$ to $C_{TSn-1}$ by output processing means not shown in FIG. 4. The output processing means can compensate the signals for the effects of the dark voltage by subtracting the output of the dark pixel from the outputs of said light receiving pixels.

Here, for the purpose of getting precise pure signal components, the dark voltage output from the dark pixel should be equal to the output of a light receiving pixels when it is dark. However, this tends not to be the case, for reasons which will now be explained.

FIGS. 5 and 6 show examples of the structures of a dark pixel and a light receiving pixel. FIG. 5(A) and (B) illustrate schematic plan views of the dark pixel and a light receiving pixel, respectively, of the photoconversion device of FIG. 4, and FIG. 6(A) and (B) illustrate cross sections along lines X—X of the dark pixel and the light receiving pixel shown in FIG. 5(A) and (B).

In those FIGS. 2 is an n+ type semiconductor region as an emitter region, 3 is a p type semiconductor region as a base region, 4 is an emitter contact hole. 5 is a light shielding layer such as Al. 6 and 7 are an n+ type semiconductor region and an n type semiconductor region, respectively, constituting a collector region. 8 and 9 are insulating layers, 10 is a conductive layer such as Al for constituting of an emitter conductive line, which is connected to the n+ type semiconductor region 2 through the contact hole 4. In FIG. 5, the n+ type semiconductor region 6, the n type semiconductor region 7, the insulating layer 8, the insulating layer 9, and the conductive layer 10 are omitted for simplification.

An area in the vicinity of a part of the base region 3 forms a light receiving region as shown in FIG. 6(A). The dark pixel is formed by covering its light receiving region with a light shielding layer 5 such as Al. As shown in FIG. 6(B), the light receiving pixels are formed without any light shielding layer over the light receiving region.

The dark voltage $V_d$ may be defined as follows:

$$V_d = \frac{I_d \cdot T_{int}}{C_B},$$

Where $I_d$ denotes a dark current, $T_{int}$ denotes a storing period, and $C_B$ denotes a base capacitance which consists of the whole parasitic capacitance of the base in a forward biased storage operation, except for the capacitance $C_{BE}$ between the base and the emitter.

However, in above mentioned photoconversion device the dark pixel has an additional parasitic capacitance between the light shielding layer 5 and the p type semiconductor region 3, so that the base capacitances CB of the dark pixel and light receiving pixels are different. This causes a difference between the output of said dark pixel and the outputs of said light receiving pixels in the absence of light. Therefore the effect of the dark voltage on the output signals cannot be completely compensated for.

Similar or corresponding problems can also occur with other types of photoconversion element. For example, with a photodiode, a photosensitive FET or a photosensitive SIT, capacitive coupling between the light shielding layer and the charge accumulation region will tend to cause the output of a dark pixel to be different from the output which would be provided by a light receiving pixel in the absence of light. In a CCD type photoconversion device, the electric field produced by a CCD electrode may be influenced by the light shielding layer, so the characteristics of the potential well may be different in a dark pixel from the characteristics in a light receiving pixel. In general, a problem will arise in any circumstances where the light shielding layer can have an electrical effect on a signal storing or signal carrying part of the device.

SUMMARY OF THE PRESENT INVENTION

It is an object of the present invention to provide an improved photoconversion device. Another object is to provide an improved design of photoconversion element.

According to one aspect of the present invention there is provided a photoconversion device having a photoconversion element for providing an output signal in accordance with light incident on it and a further element, having a light shielding means, for providing a comparison output signal, characterised by means for reducing the difference in an electrical characteristic between the photoconversion element and the further element owing to the presence of the light shielding means. Typically, the elements both comprise respective charge accumulation regions, and the electrical characteristic is a characteristic of the charge accumulation regions. The characteristic may be capacitance.

In an embodiment of the present invention the means for reducing the difference is provided between the light shielding means and the charge accumulation region. The means for reducing the difference may be an electrically conductive layer, and it may be connected to a means for controlling its potential, for example a fixed voltage source or a connection for one of the regions of the element. The means for reducing the difference may be connected to a read-out terminal of the element. Where the element has the structure of a bipolar transistor, the means for reducing the difference may be coupled to the emitter terminal.

The light shielding means is typically a layer of electrically conductive material. For example, it may be polysilicon or a metal, typically aluminium.

According to another aspect of the present invention there is provided a comparison element for a photoconversion device, comprising a charge accumulation region and a light shielding means to shield the charge accumulation region from light, characterised by means to reduce the degree of capacitive coupling between the charge accumulation region and the light shielding means. Preferably the means to minimize capacitive coupling is electrically isolated from the light shielding means.

According to yet another aspect of the present invention there is provided a comparison element for a photoconversion device comprising a charge accumulation region, a light shielding means to shield the charge accumulation region from light, and an electrically conductive region between the light shielding means and the charge accumulation region.

According to a further aspect of the present invention there is provided a photoconversion device having a photoconversion element for providing an output signal in accordance with light received by it and a comparison element for providing a comparison signal, the photoconversion element comprising a light receiving region, at least one further region and an electrode coupled to the further region, and the comparison element comprising a first region, corresponding to the light receiving region of the photoconversion element, at least one further region, an electrode coupled to the further region and light shielding means for shielding the first region from light, characterised by electrically conductive means between the light shielding means and the first region of the comparison cell.

Preferably the electrically conductive means is an extension of the electrode coupled to the further region, and in this case it is preferred that the electrode of the photoconversion element has substantially the same shape and size as that portion of the electrode of the comparison cell which does not overlap the light shielding means. This tends to minimise any difference between the photoconversion element and the comparison element in the capacitive effect of the electrode on the output signal.

Preferably, the output signal from each respective element is read out through the electrode coupled to the further region. Where the element has the form of a bipolar transistor, the further region may be the emitter.

Further features, aspects, objects and advantages of the present invention will be apparent from the following description of an embodiment given by way of non-limiting example.

BRIEF DESCRIPTION OF THE DRAWINGS

FIGS. 1(A) and 1(B) illustrate schematic plan views of a dark pixel and a light receiving pixel of an embodiment of the present photoconversion device.

FIGS. 2(A) and 2(B) are cross-sections along lines X—X of the dark pixel and light receiving pixels respectively shown in FIG. 1(A), (B).

FIGS. 7(A), 7(B), 8(A) and 8(B) are views corresponding to FIGS. 1(A), 1(B), 2(A) and 2(B) of an alternative arrangement for the embodiment of FIGS. 1(A), 1(B), 2(A) and 2(B).

DETAILED DESCRIPTION OF THE ILLUSTRATED EMBODIMENT

Figure 3:
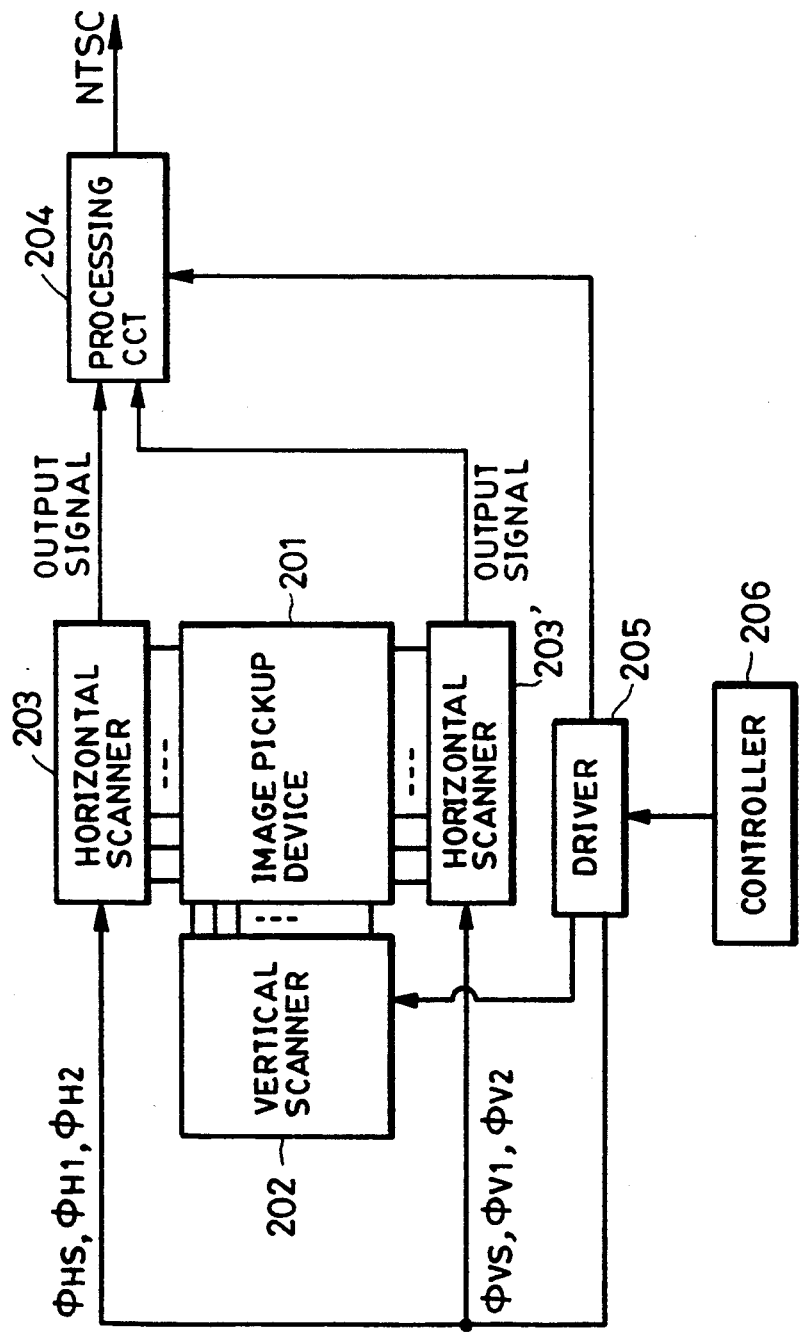
FIG. 3 illustrates a schematic circuit diagram of a solid state image pickup apparatus which uses the photoconversion device of FIGS. 1(A), 1(B), 2(A) and 2(B).
Figure 4:
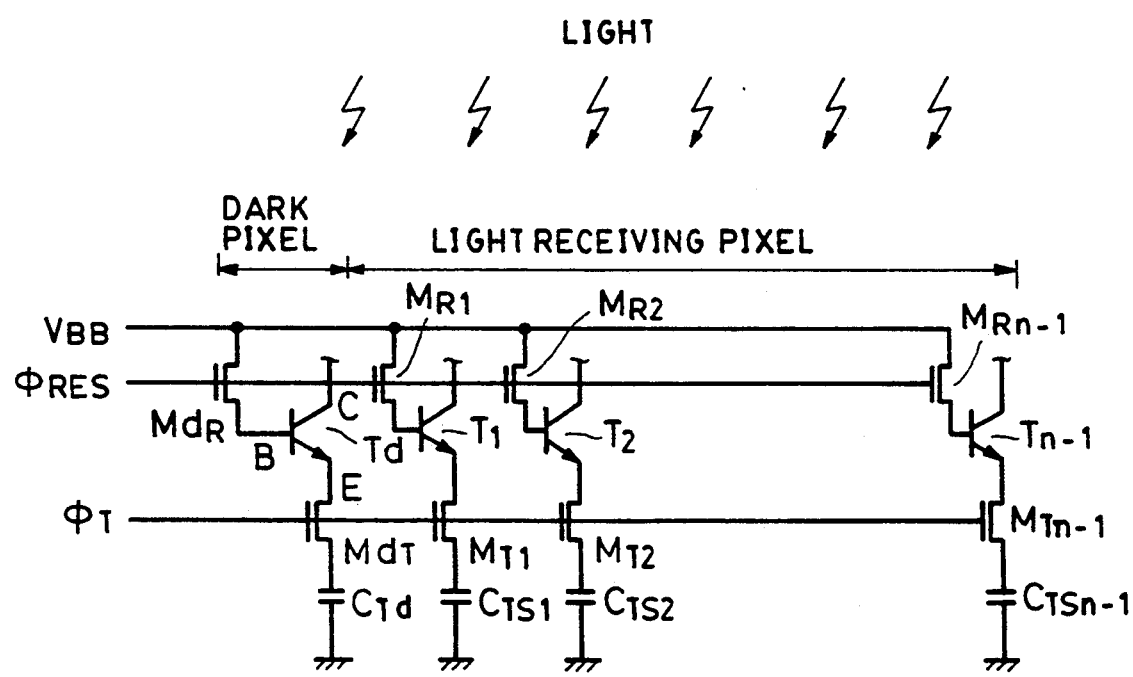
FIG. 4 illustrates a circuit diagram of a photoconversion device.
Figure 5A:
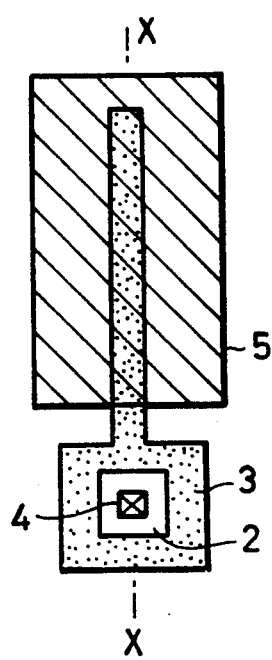
FIGS. 5(A) and 5(B) are schematic plan views of a dark pixel and a light receiving pixel of a photoconversion device not embodying the present invention.
Figure 5B:
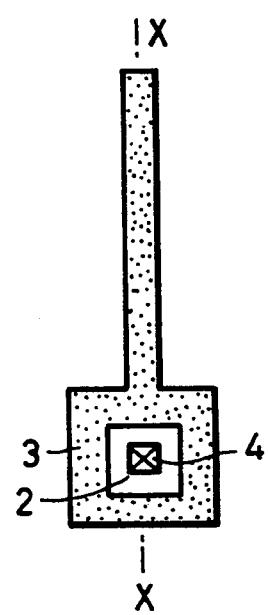
Figure 6A:
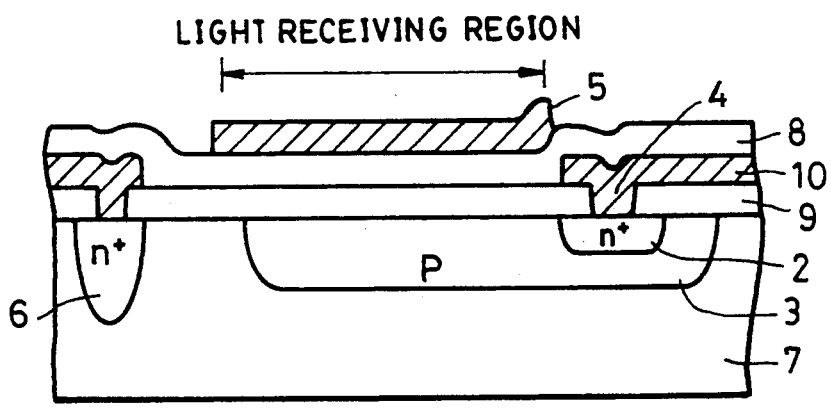
FIGS. 6(A) and 6(B) are cross-sections along lines X—X of the dark pixel and the light receiving pixel respectively shown in FIGS. 5(A) and 5(B).
Figure 6B:
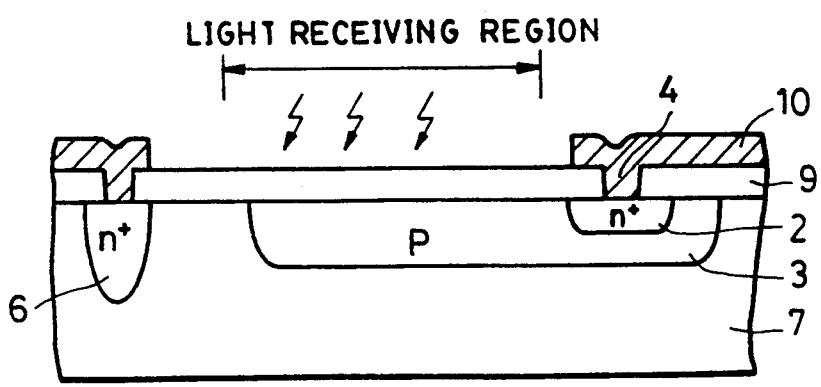

In the figures the same components or corresponding components in different figures are denoted by the same numbers, and an explanation of them is omitted where they have already been explained.

In this embodiment the dark pixel has a conductive layer 1 such as Al, which is located above the p type semiconductor region 3 (a base region) on an insulating layer 9 as shown in FIG. 1(A) and FIG. 2(A). The conductive layer 1 is electrically connected to the n+ type semiconductor emitter region region 2 through a contact hole 4. Above the conductive layer 1 on an insulating layer 8 a light shielding layer 5 such as Al is located.

The conductive layer 1 serves as an electrical shield by covering the p type semiconductor base region 3 as well as providing an emitter conductive line. The conductive layer 1 and the emitter conductive line can be separated, e.g. if it is desired to connect the conductive layer 1 to a fixed voltage.

On the light receiving pixels, as shown in FIG. 1(B) and FIG. 2(B), a conductive layer 1 such as Al is located on an insulating layer 9. It is not necessary to cover a part of the p type semiconductor base region 3 with the conductive layer 1 in the light receiving pixels, but in this embodiment the conductive layer 1 covers a part of the p type base region 3, as shown in FIG. 2B, for more effectively reducing the difference between the parasitic capacitances $C_{BE}$ (capacitances between the base and the emitter) of the dark pixel and the light receiving pixels. This structure serves to increase the parasitic capacitance $C_{BE}$ of the light receiving pixels so as to make it more nearly equal to the parasitic capacitance $C_{BE}$ of the dark pixel.

Even in this embodiment, because of the difference between the sizes of the conductive layers 1 for the dark pixel and the light receiving pixels, the parasitic capacitances $C_{BE}$ of the dark pixel and the light receiving pixels are different. However the parasitic capacitances between the light shielding layer 5 (such as Al) and the p type semiconductor base region 3 can be negligible, because of the presence of a capacitance adjusting means such as the conductive layer 1. Therefore, the total of the base parasitic capacitance $C_B$, which has a strong effect on the dark voltage, is not greatly different for the dark pixel and the light receiving pixels.

Therefore, according to this embodiment the dark voltages of the dark pixel and light receiving pixels are almost the same and a (better compensated) light signal component can be obtained.

In FIGS. 1 and 2, the conductive layer 1 for the light receiving pixel is shown as having substantially the same size and shape as the portion of the conductive layer 1 for the dark pixel which is not beneath the light shielding layer 5. The light shielding layer 5 extends over a part of the pixel including most of the base and an adjacent part of the collector, which would form the active light receiving region in the absence of the light shielding layer.

However, in practice it is likely that the electrode area of each pixel around the emitter 2 will be shielded from light as well. FIGS. 7(A), 7(B), 8(A) and 8(B) show an alternative arrangement in which the light shielding layer 5 extends over the whole of the dark pixel, and the light pixel has a light shielding layer 5 extending over its electrode area. In this case also, the conductive layer 1 of the light pixel is enlarged. It is substantially the same shape and size as the conductive layer 1 of the dark pixel to the extent possible without it extending substantially beyond the light shielding layer 5 of the light pixel.

Instead of providing the additional conductive layer 1, it is possible to provide a substance of reduced dielectric constant between the light shielding layer and the p type semiconductor region in order to reduce the capacitance between them.

FIG. 3 illustrates a schematic circuit diagram of an image pickup apparatus which embodies this invention.

In the figure an image pickup device 201 consists of a large number of photoconversion elements which are arranged in row and column directions and are driven by a vertical scanner 202 and horizontal scanners 203, 203' in synchronism with a standard television format.

Here the horizontal scanners 203, 203' read out signals pixel by pixel in each line.

The signals output from the horizontal scanners 203, 203' are processed by a processing circuit 204 and are output as a standard television signal. In this process, the output signal of said dark pixel is initially stored in the processing circuit 204 and then the stored signal is subtracted from the output signals of the light receiving pixels.

Drive pulses $\phi_{HS}$, $\phi_{H1}$, $\phi_{H2}$, $\phi_{VS}$, $\phi_{V1}$, $\phi_{V2}$ for the vertical and the horizontal scanners 202, 203, 203' are supplied by a driver circuit 205, and the driver 205 is controlled by a controller 206.

As explained above, in these embodiments the difference in capacitance caused by the parasitic capacitance between the light shielding region and the charge storage region is reduced by providing the conductive layer 1 in the dark pixel and by enlarging the electrode region 1 in the light receiving pixels, so that the difference between the output voltages of the first (dark pixel) photo conversion element and the second (light pixel) photoconversion element when both are in a dark condition can be reduced. Therefore, a more precise corrected light signal component can be obtained.

Meanwhile although in these embodiments a bipolar transistor is exemplified as a photoconversion element, other types of photoconversion elements such as a CCD, a MOS X-Y device, SIT, photodiode etc. can be used.

What is claimed is:

1. Photoconversion device comprising:
a first photoconversion element having a photoconversion region for accumulating carriers caused by incident light; and
a second photoconversion element having a photoconversion region for producing dark output that is corresponding to the dark output of said first photoconversion element and having a light shielding region over the photoconversion region,
said photoconversion device further comprising a capacitance adjusting means located near the photoconversion region of said second photoconversion element for reducing the difference between the capacitances of said photoconversion regions of said first and second photoconversion elements.

2. Photoconversion device according to claim 1, wherein said capacitance adjusting means comprises a conductive layer.

3. Photoconversion device according to claim 2, wherein said conductive layer is located between said light shielding region and said photoconversion region of said second photoconversion element.

4. Photoconversion device according to claim 1, wherein each said photoconversion element has a control electrode region as the photoconversion region and a main electrode region for outputting a signal corresponding to the carriers accumulated in the control electrode region.

5. Photoconversion device according to claim 4 further comprising a conductive layer located over a part of said control electrode region of said first photoconversion element wherein said conductive layer and the main electrode region of said first photoconversion element are electrically connected.

6. A photoconversion device comprising first and second elements, each element comprising a first portion, the first portion of the first element being exposed to light and the first element being for providing an output signal in accordance with the amount of light received by its first portion, and the second element further comprising light shielding means for shielding its first portion from light, the second element being for providing a comparison output signal,
the second element further comprising further means for reducing an electrical effect on the comparison output signal of the presence of the light shielding means.

7. A photoconversion device according to claim 6 in which the first portion of each said element comprises at least a part of a charge accumulation region.

8. A photoconversion device according to claim 7 in which the further means reduces the effect of the presence of the light shielding means on an electrical parameter of the charge accumulation region.

9. A photoconversion device according to claim 8 in which the electrical parameter is capacitance.

10. A photoconversion device according to claim 6 in which the further means is an electrical conductor or a low dielectric material.

11. A photoconversion device according to claim 6 in which the further means is electrically isolated from the light shielding means.

12. A photoconversion device according to claim 6 in which the further means is coupled to a fixed electrical potential.

13. A photoconversion device according to claim 6 in which the further means is coupled to an electrode for a region of the element.

14. A photoconversion device according to claim 13 in which the electrode carries the comparison output signal.

15. A photoconversion device according to claim 6 in which each said element comprises an electrode and the elements have substantially identical arrangements of parts in the vicinity of the electrode, the light shielding means of the second element shielding the vicinity of the electrode from light and the second element further comprising a light shielding means shielding the vicinity of the electrode from light but leaving a part of the first portion unshielded, the electrode of the first element comprising an electrode region having substantially the same size and shape as either (i) the electrode of the second element, or (ii) where a part of the electrode of the second element extends beyond the area corresponding to the area of the first element shielded by the light shielding means of the first element, the part of the electrode of the second element which does not so extend.

16. A comparison element for a photoconversion device, the element comprising a first portion, which comprises at least a part of a charge accumulation region and light shielding means for shielding the first portion from light, the element providing a comparison output signal in accordance with the amount of charges accumulated in the charge accumulation region, the element further comprising further means for reducing an electrical effect on the comparison output signal of the presence of the light shielding means.

17. An element according to claim 16 in which the further means reduces the effect of the presence of the light shielding means on an electrical parameter of the charge accumulation region.

18. An element according to claim 17 in which the electrical parameter is capacitance.

19. An element according to claim 16 in which the further means is an electrical conductor or a low dielectric material.

20. An element according to claim 16 in which the further means is electrically isolated from the light shielding means.

21. An element according to claim 16 in which the further means is coupled to a fixed electrical potential.

22. An element according to claim 16 in which the further means is coupled to an electrode for a region of the element.

23. An element according to claim 22 in which the electrode carries the comparison output signal.

24. A photoconversion device comprising first and second elements, each element comprising a first portion, the first portion of the first element being exposed to light and the first element being for providing an output in accordance with the amount of light received by its first portion, and the second element further comprising light shielding means for shielding its first portion from light, the second element being for providing a comparison output signal, the second element further comprising a conductive layer or a low dielectric layer between its first portion and the light shielding means.

25. A photoconversion device according to claim 24 in which the conductive layer or low dielectric layer is electrically isolated from the light shielding means.

* * * * *

UNITED STATES PATENT AND TRADEMARK OFFICE
CERTIFICATE OF CORRECTION

PATENT NO. : 5,159,186

DATED : October 27, 1992

INVENTOR(S) : Hayao Ohzu

It is certified that error appears in the above-indentified patent and that said Letters Patent is hereby corrected as shown below:

On the title page, Item

AT [56] REFERENCES CITED

U.S. Patent Documents, insert,
--4,879,470  11/89  Sugawa et al. .....250/208.1--.
  4,905,033   2/90  Ishida et al. .....354/402--.

Foreign Patent Documents, insert
--  0260,858  7/87 Europe
    63-114,254  9/88 Japan--.

COLUMN 1

Line 29, "as for example" should read
        --as, for example,--.
Line 68, "FIG." should read --FIGS.--.

COLUMN 2

Line 2, "FIG." should read --FIGS.--.
Line 3, "FIGS." should read --FIGS.,--.
Line 34, "above mentioned" should read
        --the above-mentioned--.

COLUMN 3

Line 33, "Preferably" should read --Preferably,--.
Line 65, "minimise" should read --minimize--.

UNITED STATES PATENT AND TRADEMARK OFFICE
CERTIFICATE OF CORRECTION

PATENT NO. : 5,159,186
DATED : October 27, 1992
INVENTOR(S) : Hayao Ohzu

It is certified that error appears in the above-indentified patent and that said Letters Patent is hereby corrected as shown below:

COLUMN 4

Line 16, "FIG. 1(A), (B)." should read --FIGS. 1(A) and (B).--.
Line 45, "region" (second occurrence) should be deleted.

COLUMN 5

Line 5, "However" should read --However,--.

COLUMN 6

Line 6, "Meanwhile" should read --Meanwhile,--.
Line 41, "claim 4" should read --claim 4,--.
Line 60, "claim 6" should read --claim 6,--.
Line 63, "claim 7" should read --claim 7,--.
Line 67, "claim 8" should read --claim 8,--.

COLUMN 7

Line 1, "claim 6" should read --claim 6,--.
Line 4, "claim 6" should read --claim 6,--.
Line 7, "claim 6" should read --claim 6,--.
Line 11, "claim 6" should read --claim 6,--.
Line 14, "claim 13" should read --claim 13,--.
Line 17, "claim 6" should read --claim 6,--.

UNITED STATES PATENT AND TRADEMARK OFFICE
CERTIFICATE OF CORRECTION

PATENT NO. : 5,159,186
DATED     : October 27, 1992
INVENTOR(S) : Hayao Ohzu

It is certified that error appears in the above-indentified patent and that said Letters Patent is hereby corrected as shown below:

<u>COLUMN 8</u>

```
Line  7, "claim 16" should read --claim 16,--.
Line 11, "claim 17" should read --claim 17,--.
Line 13, "claim 16" should read --claim 16,--.
Line 16, "claim 16" should read --claim 16,--.
Line 19, "claim 16" should read --claim 16,--.
Line 21, "claim 16" should read --claim 16,--.
Line 24, "claim 22" should read --claim 22,--.
Line 38, "claim 24" should read --claim 24,--.
```

Signed and Sealed this

Twelfth Day of April, 1994

Attest:

BRUCE LEHMAN

*Attesting Officer*    *Commissioner of Patents and Trademarks*